(12) United States Patent
Kaushik et al.

(10) Patent No.: US 11,853,157 B2
(45) Date of Patent: Dec. 26, 2023

(54) ADDRESS FAULT DETECTION SYSTEM (71) Applicant: NXP B.V., Eindhoven (NL)

(72) Inventors: Arvind Kaushik, Noida (IN); Aarul Jain, New Delhi (IN); Nishant Jain, Noida (IN)

(73) Assignee: NXP B.V., Eindhoven (NL)

( * ) Notice: Subject to any disclaimer, the term of this patent is extended or adjusted under 35 U.S.C. 154(b) by 128 days.

(21) Appl. No.: 17/455,245

(22) Filed: Nov. 17, 2021

(65) Prior Publication Data
US 2023/0153197 A1    May 18, 2023

(51) Int. Cl.
*G06F 11/10* (2006.01)
*G06F 3/06* (2006.01)

(52) U.S. Cl.
CPC ........ *G06F 11/1016* (2013.01); *G06F 3/0604* (2013.01); *G06F 3/0655* (2013.01); *G06F 3/0673* (2013.01); *G06F 2201/805* (2013.01)

(58) Field of Classification Search
CPC .. G06F 11/1016; G06F 3/0604; G06F 3/0655; G06F 3/0673; G06F 2201/805
USPC ........................................................ 714/768
See application file for complete search history.

(56) References Cited

U.S. PATENT DOCUMENTS

| | | | |
|---|---|---|---|
| 5,784,393 A * | 7/1998 | Byers | G06F 11/10 714/E11.053 |
| 6,131,177 A * | 10/2000 | Takeuchi | G06F 11/106 714/767 |
| 7,203,890 B1 | 4/2007 | Normoyle | |
| 8,560,899 B2 | 10/2013 | Brewerton et al. | |
| 8,812,935 B2 | 8/2014 | Loewenstein | |
| 10,998,077 B2 | 5/2021 | Bhasin et al. | |
| 11,055,172 B2 | 7/2021 | Foley | |
| 2004/0117723 A1* | 6/2004 | Foss | H03M 13/095 714/E11.041 |
| 2017/0161202 A1* | 6/2017 | Erez | G06F 12/10 |
| 2020/0110659 A1* | 4/2020 | Foley | G06F 11/1076 |
| 2021/0012853 A1 | 1/2021 | Murozuka | |

FOREIGN PATENT DOCUMENTS

JP    H05189997 A  *  1/1992

* cited by examiner

*Primary Examiner* — Albert Decady
*Assistant Examiner* — Enam Ahmed (57) ABSTRACT

An address fault detection system includes write and read access circuits and a fault management circuit. The write access circuit receives an address and reference data for a write operation associated with a memory and parity data generated based on the reference data, and writes the reference data and the parity data to first and second memory blocks of the memory, respectively. The read access circuit receives the same address for a read operation associated with the memory and reads another reference data and another parity data from the first and second memory blocks, respectively. The fault management circuit compares the read parity data with parity data generated based on the read reference data to detect an address fault in the memory. The written and read reference data are different when the address fault is detected, and same when the address fault is not detected.

14 Claims, 4 Drawing Sheets

ADDRESS FAULT DETECTION SYSTEM

FIELD OF USE

The present disclosure relates generally to electronic circuits, and, more particularly, to an address fault detection system to detect address faults in a memory.

BACKGROUND

An integrated circuit (IC) typically includes high-speed memories that store binary data. Such memories have address translators associated therewith that facilitate data storage and data retrieval operations (e.g., write and read operations, respectively). These address translators experience various faults which are referred to as address faults. The address faults degrade the reliability of the IC.

SUMMARY

In an embodiment of the present disclosure, an integrated circuit (IC) is disclosed. The IC may include a memory and an address fault detection system that may be coupled to the memory. The memory may include a first memory block that may be configured to store a first reference data set, and a second memory block that may be configured to store a first parity data set associated with the first reference data set, respectively. The address fault detection system may include a read access circuit that may be coupled to the memory. The read access circuit may be configured to receive a first address for a read operation associated with the memory. The read access circuit may be further configured to read, based on the first address, first reference data of the first reference data set from the first memory block, and first parity data of the first parity data set from the second memory block. The address fault detection system may further include a fault management circuit that may be coupled to the read access circuit. The fault management circuit may be configured to receive the first reference data and the first parity data. Further, the fault management circuit may be configured to generate second parity data based on the first reference data, and compare the first parity data and the second parity data to detect an address fault in the memory.

In some embodiments, the IC may further include a functional circuit that may be configured to initiate the read operation. The fault management circuit may be further coupled to the functional circuit. The fault management circuit may be further configured to generate a fault indication signal that is indicative of the detected address fault. When the first parity data matches the second parity data, the fault indication signal is deactivated to indicate absence of the address fault. Further, when the first parity data does not match the second parity data, the fault indication signal is activated to indicate presence of the address fault. The fault management circuit may be further configured to provide the fault indication signal and the first reference data to the functional circuit.

In some embodiments, the fault management circuit may include a controller that may be coupled to the read access circuit and the functional circuit. The controller may be configured to receive the first reference data and the first parity data. The fault management circuit may further include a parity generator that may be coupled to the controller. The parity generator may be configured to receive the first reference data from the controller and generate the second parity data based on the first reference data. The fault management circuit may further include a comparator that may be coupled to the controller, the parity generator, and the functional circuit. The comparator may be configured to receive the first parity data and the second parity data from the controller and the parity generator, respectively. Further, the comparator may be configured to compare the first parity data and the second parity data to detect the address fault in the memory and generate the fault indication signal indicative of the detected address fault. The controller and the comparator may be further configured to provide the first reference data and the fault indication signal to the functional circuit, respectively.

In some embodiments, the first address includes a first address bit that corresponds to a most significant bit of the first address. The first address further includes a first set of address bits that is indicative of a second address of the first and second memory blocks.

In some embodiments, the first reference data is stored at the second address of the first memory block, and the first parity data is stored at the second address of the second memory block when the address fault is not present in the memory.

In some embodiments, to read the first reference data and the first parity data from the first and second memory blocks, respectively, the read access circuit may be further configured to provide the second address to each of the first and second memory blocks. Further, the read access circuit may be configured to receive the first reference data and third parity data as a response from the first memory block, and second reference data and the first parity data as a response from the second memory block. Based on the first address bit, the first reference data and the first parity data are read from the first and second memory blocks, respectively.

In some embodiments, the second memory block may be further configured to store a second reference data set, and the first memory block may be further configured to store a second parity data set associated with the second reference data set, respectively. The second reference data set may include the second reference data, and the second parity data set may include the third parity data.

In some embodiments, the first reference data and the third parity data may be stored in the first memory block in a concatenated manner. Further, the second reference data and the first parity data may be stored in the second memory block in a concatenated manner.

In some embodiments, the read access circuit may include an address decoder that may be coupled to the functional circuit and the first and second memory blocks. The address decoder may be configured to receive the first address from the functional circuit, decode the first address to extract the second address, and provide the second address to each of the first and second memory blocks.

In some embodiments, the read access circuit may further include a first multiplexer and a second multiplexer. The first multiplexer has a first input terminal that may be coupled to the first memory block and a second input terminal that may be coupled to the second memory block. The first and second input terminals of the first multiplexer may be configured to receive the first reference data and the second reference data from the first and second memory blocks, respectively. The first multiplexer further has a control terminal that may be configured to receive a second address bit that is an inverted version of the first address bit. Further, the first multiplexer has an output terminal that may be configured to output, based on the second address bit, one of the first reference data and the second reference data as first control data. The second multiplexer has a first input terminal that may be coupled to the second memory block and a second input terminal that may be coupled to the first memory block. The first and second input terminals of the second multiplexer may be configured to receive the first parity data and the third parity data from the second and first memory blocks, respectively. The second multiplexer further has a control terminal that may be configured to receive the second address bit. Further, the second multiplexer has an output terminal that may be configured to output, based on the second address bit, one of the first parity data and the third parity data as second control data.

In some embodiments, the address fault detection system may further include an inverter that is configured to receive the first address bit and output the second address bit.

In some embodiments, the address fault detection system may further include a concatenation circuit that may be coupled to the output terminals of the first and second multiplexers and the fault management circuit. The concatenation circuit may be configured to receive the first control data and the second control data from the output terminals of the first and second multiplexers, respectively. The concatenation circuit may be further configured to concatenate the first control data and the second control data to generate concatenated data, and provide the concatenated data to the fault management circuit. The concatenated data includes the first reference data and the first parity data when the first address bit is activated.

In another embodiment of the present disclosure, an IC is disclosed. The IC may include a memory and an address fault detection system that may be coupled to the memory. The memory may include a first memory block and a second memory block. The address fault detection system may include a parity generator that may be configured to receive first reference data for a write operation associated with the memory. The parity generator may be further configured to generate first parity data based on the first reference data. The address fault detection system may further include a write access circuit that may be coupled to the parity generator and the memory. The write access circuit may be configured to receive a first address for the write operation, the first reference data, and the first parity data. The write access circuit may be further configured to write, based on the first address, the first reference data to the first memory block, and the first parity data to the second memory block. An address fault is detected in the memory based on the first reference data and the first parity data written to the first memory block and the second memory block, respectively.

In some embodiments, the first address includes a first address bit that corresponds to a most significant bit of the first address. The first address further includes a first set of address bits that is indicative of a second address of the first and second memory blocks.

In some embodiments, the write access circuit writes the first reference data at the second address of the first memory block, and the first parity data at the second address of the second memory block.

In some embodiments, the write access circuit may include an address decoder and a controller. The address decoder may be coupled to the first and second memory blocks. The address decoder may be configured to receive the first address, decode the first address to extract the second address and the first address bit, and provide the second address to each of the first and second memory blocks. The controller may be coupled to the parity generator and the first and second memory blocks. The controller may be configured to receive the first reference data and the first parity data, and write the first reference data to the first memory block and the first parity data to the second memory block.

In some embodiments, the address fault detection system may further include an inverter that is coupled to the address decoder. The inverter may be configured to receive the first address bit and output a second address bit that is an inverted version of the first address bit.

In some embodiments, the address decoder and the inverter may be further configured to provide the first and second address bits to a first set of enable pins and a second set of enable pins associated with the first memory block, respectively. The address decoder and the inverter may be further configured to provide the first and second address bits to a third set of enable pins and a fourth set of enable pins associated with the second memory block, respectively. The first set of enable pins and the fourth set of enable pins are associated with reference data storage in the first and second memory blocks, respectively. Further, the second set of enable pins and the third set of enable pins are associated with parity data storage in the first and second memory blocks, respectively.

In yet another embodiment of the present disclosure, an IC is disclosed. The IC may include a memory and an address fault detection system that may be coupled to the memory. The memory may include a first memory block and a second memory block. The address fault detection system may include a parity generator that may be configured to receive a first reference data set for a set of write operations associated with the memory, respectively, and generate a first parity data set based on the first reference data set, respectively. The address fault detection system may further include a write access circuit that may be coupled to the parity generator and the memory. The write access circuit may be configured to receive a set of addresses for the set of write operations, respectively, the first reference data set, and the first parity data set, and write the first reference data set to the first memory block and the first parity data set to the second memory block. The address fault detection system may further include a read access circuit that may be coupled to the memory. The read access circuit may be configured to receive a first address for a read operation associated with the memory. Based on the first address, the read access circuit may be configured to read first reference data of the first reference data set from the first memory block and first parity data of the first parity data set from the second memory block. The set of addresses may include the first address. The address fault detection system may further include a fault management circuit that may be coupled to the read access circuit. The fault management circuit may be configured to receive the first reference data and the first parity data, generate second parity data based on the first reference data, and compare the first parity data and the second parity data to detect an address fault in the memory.

Various embodiments of the present disclosure disclose an integrated circuit (IC) including a memory and an address fault detection system. The address fault detection system may include a parity generator, a write access circuit, a read access circuit, and a fault management circuit. The parity generator may generate first parity data based on first reference data received from a functional circuit of the IC. The write access circuit may write the first reference data to a first memory block of the memory and the first parity data to a second memory block of the memory. Each memory block may include a dedicated address translator and a storage element. The write access circuit may write the first reference data and the first parity data to the first and second memory blocks, respectively, based on an address received from the functional circuit. The address and the first reference data are generated by the functional circuit based on initiation of a write operation with the memory.

The read access circuit may read second reference data and second parity data from the first and second memory blocks, respectively. The read access circuit reads the second reference data and the second parity data in response to a read operation initiated by the functional circuit with the memory using the same address. The fault management circuit receives the second reference data and the second parity data, generates third parity data based on the second reference data, compares the second parity data and the third parity data, and generates a fault indication signal based on a result of the comparison. The fault indication signal is indicative of the presence or the absence of an address fault in the memory. The address fault detection system of the present disclosure thus detects the address fault in the memory, thereby increasing the reliability of the IC.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

An integrated circuit (IC) includes various memories that may experience address faults. To detect address faults in a memory, an address fault detection system may be included in the IC. A conventional address fault detection system generates parity data during a write operation associated with the memory based on reference data that is to be stored in the memory and a reference address associated with the write operation. Further, the conventional address fault detection system writes the parity data and the reference data to one memory block of the memory at the reference address thereof. During a subsequent read operation associated with the same reference address, the conventional address fault detection system reads the stored reference data and the stored parity data from the memory block, and generates another parity data based on the read reference data and the reference address. Further, the read parity data is compared with the generated parity data to detect the presence of the address fault. The address fault detection system includes two parity generators for generating the parity data during the write and read operations, respectively. Typically, a parity generator generates parity data based on exclusively the reference data. As the conventional address fault detection system additionally utilizes the reference address for generating the parity data, various circuitries are required to be additionally included in the parity generators. Thus, the generation of the parity data based on the reference address and the reference data results in an introduction of a delay during the write and read operations. Additionally, there is a significant increase in a design complexity and a size of the address fault detection system, and in turn, of the IC.

Figure 1:
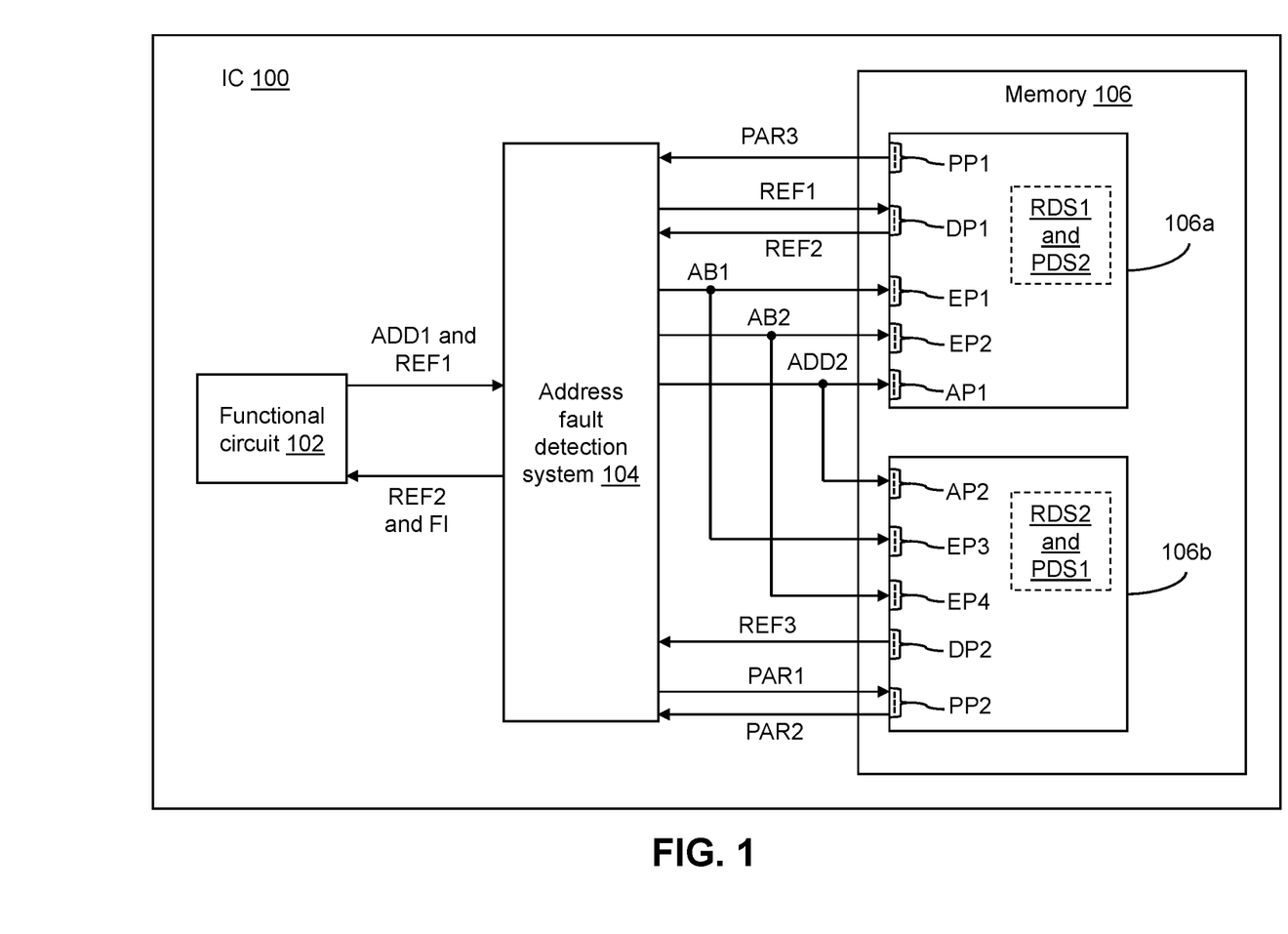
FIG. 1 illustrates a schematic block diagram of an integrated circuit (IC) in accordance with an embodiment of the present disclosure.

FIG. 1 illustrates a schematic block diagram of an integrated circuit (IC) 100 in accordance with an embodiment of the present disclosure. The IC 100 of the present disclosure may be implemented in autonomously driven cars, electric vehicle motor control and diagnostic devices, power trains, artificial intelligence and machine learning devices, or the like. The IC 100 may include a set of functional circuits of which a functional circuit 102 is shown. The IC 100 may further include an address fault detection system 104 and a memory 106. Further, the memory 106 may include a plurality of memory blocks of which a first memory block 106a and a second memory block 106b are shown.

The following table illustrates various signals and data described in FIG. 1.

| Signal/Data | Description |
| --- | --- |
| First address ADD1 | Address of the memory 106 at which a write operation is to be performed |
| First address bit AB1 | Most significant bit of the first address ADD1 |
| Second address bit AB2 | Inverted version of the first address bit AB1 |
| Second address ADD2 | Indicated by remaining bits (e.g., bits apart from the most significant bit) of the first address ADD1, and is associated with the first and second memory blocks 106a and 106b |
| First reference data REF1 | Binary data that is to be written at the first address ADD1 of the memory 106 |
| First parity data PAR1 | Parity data generated based on the first reference data REF1 |
| First reference data set RDS1 | Binary data (including the first reference data REF1) written to (e.g., stored in) the first memory block 106a |
| First parity data set PDS1 | Parity data generated for each reference data of the first reference data set RDS1 and written to the second memory block 106b |
| Second reference data set RDS2 | Binary data written to the second memory block 106b |

-continued

| Signal/Data | Description |
| --- | --- |
| Second parity data set PDS2 | Parity data generated for each reference data of the second reference data set RDS2 and written to the first memory block 106a |
| Second and third reference data REF2 and REF3 | Reference data received from the first and second memory blocks 106a and 106b, respectively, based on the second address ADD2 when a read operation is performed |
| Second and third parity data PAR2 and PAR3 | Parity data received from the second and first memory blocks 106b and 106a, respectively, based on the second address ADD2 when the read operation is performed |
| Fault indication signal FI | Indicates whether address fault is present or absent in the memory 106 |

The functional circuit 102 may be coupled to the address fault detection system 104. Further, the functional circuit 102 may be coupled to the memory 106 by way of the address fault detection system 104. The functional circuit 102 may include suitable circuitry that may be configured to perform one or more operations. For example, the functional circuit 102 may be configured to initiate various memory operations, such as write and read operations, with the memory 106. Examples of the functional circuit 102 may include a digital signal processor, a memory controller, a direct memory access controller, a sigma-delta analog-to-digital converter, or the like.

Write Operation:

When the functional circuit 102 initiates a write operation with the memory 106, the functional circuit 102 may be further configured to generate and provide a first address ADD1 and first reference data REF1 to the address fault detection system 104. The first reference data REF1 is further written to the memory 106 by the address fault detection system 104 based on the first address ADD1.

Read Operation:

When the functional circuit 102 initiates a read operation with the memory 106, the functional circuit 102 may be further configured to generate and provide the first address ADD1 (e.g., the same address utilized for the write operation) to the address fault detection system 104. In such a scenario, the functional circuit 102 may be further configured to receive second reference data REF2 and a fault indication signal FI from the address fault detection system 104. The fault indication signal FI may be indicative of an address fault detected in the memory 106. In an embodiment, the fault indication signal FI is deactivated (e.g., is at a logic low state) when the address fault is not detected in the memory 106. In such a scenario, the second reference data REF2 may be the same as the first reference data REF1, and the functional circuit 102 may be configured to perform one or more functional operations associated therewith based on the second reference data REF2. Further, the fault indication signal FI is activated (e.g., is at a logic high state) when the address fault is detected in the memory 106. In such a scenario, the functional circuit 102 may discard the received second reference data REF2.

Thus, the first reference data REF1 is written to the memory 106 based on the first address ADD1, and based on the same address, another data (e.g., the second reference data REF2) is read from the memory 106 to determine whether the memory 106 has any address faults. If the address fault is absent in the memory 106, the stored data and the read data are the same. Conversely, if the address fault is present in the memory 106, the read data may be different than the stored data.

The address fault detection system 104 may be coupled to the functional circuit 102 and the memory 106. The address fault detection system 104 may be configured to detect the address fault in the memory 106 in synchronization with one or more functionalities (e.g., the write and read operations) performed with the memory 106 as described herein.

Write Operation:

When the functional circuit 102 initiates the write operation, the address fault detection system 104 may be configured to receive the first address ADD1 and the first reference data REF1 for the write operation from the functional circuit 102. The first address ADD1 may be indicative of a memory location within the memory 106 and the first reference data REF1 may be binary data that is to be written to the memory 106. The first address ADD1 may include a first address bit AB1 and a first set of address bits (not shown). The first address bit AB1 may correspond to a most significant bit (MSB) of the first address ADD1 and the first set of address bits may be indicative of a second address ADD2 of the first and second memory blocks 106a and 106b. The address fault detection system 104 may be further configured to output a second address bit AB2 that is an inverted version of the first address bit AB1.

The address fault detection system 104 may be further configured to generate first parity data PAR1 based on the first reference data REF1. Parity data (such as the first parity data PAR1) is generated based on reference data (such as the first reference data REF1) to enable fault detection for the reference data. The first parity data PAR1 generated based on the first reference data REF1 is unique. In an example, the first parity data PAR1 corresponds to error correction code (ECC) data. Further, based on the received first address ADD1, the address fault detection system 104 may be configured to write the first reference data REF1 and the first parity data PAR1 to the memory 106. In an embodiment, the address fault detection system 104 may write the first reference data REF1 and the first parity data PAR1 to the first and second memory blocks 106a and 106b, respectively. More specifically, the address fault detection system 104 may write the first reference data REF1 at the second address ADD2 of the first memory block 106a and the first parity data PAR1 at the second address ADD2 of the second memory block 106b. To write the first reference data REF1 and the first parity data PAR1 to the first and second memory blocks 106a and 106b, respectively, the address fault detection system 104 may be further configured to provide the second address ADD2 and the first and second address bits AB1 and AB2 to each of the first and second memory blocks 106a and 106b.

The address fault detection system 104 thus performs one write operation with the memory 106. The address fault detection system 104 may similarly perform multiple write operations with the memory 106 such that a first reference data set RDS1 and a first parity data set PDS1, generated based on the first reference data set RDS1, are written to the first and second memory blocks 106a and 106b, respectively. The first reference data set RDS1 and the first parity data set PDS1 may be written to the first and second memory blocks 106a and 106b, respectively, based on a first set of write operations initiated by the functional circuit 102 with the memory 106. In other words, the functional circuit 102 may be configured to initiate the first set of write operations with the memory 106, and generate a first set of addresses (not shown) and the first reference data set RDS1. The address fault detection system 104 may be configured to receive the first set of addresses and the first reference data set RDS1 from the functional circuit 102, and generate the first parity data set PDS1 based on the first reference data set RDS1, respectively. Further, the address fault detection system 104 may be configured to write, based on the first set of addresses, the first reference data set RDS1 and the first parity data set PDS1 to the first and second memory blocks 106a and 106b, respectively, in a similar manner as described above. The first reference data set RDS1 may include the first reference data REF1, the first parity data set PDS1 may include the first parity data PAR1, and the first set of addresses may include the first address ADD1.

The first and second memory blocks 106a and 106b are not limited to reference data storage and parity data storage, respectively. The address fault detection system 104 may similarly perform a second set of write operations with the memory 106 such that a second reference data set RDS2 and a second parity data set PDS2, generated based on the second reference data set RDS2, are written to the second and first memory blocks 106b and 106a, respectively. The second set of write operations may be initiated by the functional circuit 102. Further, the second reference data set RDS2 and the second parity data set PDS2 may be written to the memory 106 in a similar manner as described above. At each address of the first memory block 106a, one reference data of the first reference data set RDS1 and one parity data of the second parity data set PDS2 are stored in a concatenated manner. Similarly, at each address of the second memory block 106b, one reference data of the second reference data set RDS2 and one parity data of the first parity data set PDS1 are stored in a concatenated manner.

Read Operation:

When the functional circuit 102 initiates the subsequent read operation, the address fault detection system 104 may be configured to receive the first address ADD1 for the read operation from the functional circuit 102. The address fault detection system 104 may be further configured to provide the second address ADD2 to each of the first and second memory blocks 106a and 106b. In other words, the address fault detection system 104 may be further configured to provide the first set of address bits of the first address ADD1 to each of the first and second memory blocks 106a and 106b.

In response to the second address ADD2, the address fault detection system 104 may be further configured to receive the second reference data REF2, third reference data REF3, second parity data PAR2, and third parity data PAR3 from the memory 106. In an embodiment, the address fault detection system 104 may receive the second reference data REF2 and the third parity data PAR3 from the first memory block 106a, and the third reference data REF3 and the second parity data PAR2 from the second memory block 106b. The second parity data PAR2 is associated with (e.g., is generated based on) the second reference data REF2 and the third parity data PAR3 is associated with (e.g., is generated based on) the third reference data REF3. In an example, the second parity data PAR2 and the third parity data PAR3 correspond to ECC data. The first and second reference data sets RDS1 and RDS2 may include the second reference data REF2 and the third reference data REF3, respectively. Further, the first and second parity data sets PDS1 and PDS2 may include the second parity data PAR2 and the third parity data PAR3, respectively.

Based on the second address bit AB2, the address fault detection system 104 may be configured to select one of the second reference data REF2 and the third reference data REF3, and one of the second parity data PAR2 and the third parity data PAR3 for responding to the functional circuit 102. For the sake of ongoing discussion, it is assumed that the second reference data REF2 and the second parity data PAR2 are selected. Thus, based on the first address ADD1, the address fault detection system 104 may be configured to read the second reference data REF2 of the first reference data set RDS1 and the second parity data PAR2 of the first parity data set PDS1 from the first and second memory blocks 106a and 106b, respectively.

Address Fault Detection:

The address fault detection system 104 may be further configured to generate fourth parity data (shown later in FIG. 2) based on the second reference data REF2, and compare the fourth parity data with the second parity data PAR2. In an example, the fourth parity data corresponds to ECC data. Based on a result of the comparison, the address fault detection system 104 may be configured to detect the address fault in the memory 106. When the second parity data PAR2 and the fourth parity data match, the address fault is absent in the memory 106. On the other hand, a mismatch between the second parity data PAR2 and the fourth parity data indicates the presence of the address fault in the memory 106 (e.g., in at least one of the first and second memory blocks 106a and 106b). The address fault detection system 104 may be further configured to generate the fault indication signal FI indicative of the detected address fault. Further, the address fault detection system 104 may be configured to provide the second reference data REF2 and the fault indication signal FI to the functional circuit 102.

Thus, if an address fault is present in any of the first and second memory blocks 106a and 106b, there is a mismatch between the read parity data (e.g., the second parity data PAR2) and the parity data (e.g., the fourth parity data) generated based on the read reference data (e.g., the second reference data REF2). In such a scenario, the second reference data REF2 or the second parity data PAR2 may be stored at a different address than the second address ADD2. If the first and second memory blocks 106a and 106b are devoid of any address faults, the read parity data and the parity data generated based on the read reference data match. The second reference data REF2 and the second parity data PAR2 may thus be stored at the second address ADD2 of the first and second memory blocks 106a and 106b, respectively, when the address fault is absent in the memory 106. Hence, writing reference data in one memory block (e.g., the first memory block 106a) and associated parity data in another memory block (e.g., the second memory block 106b) enables the detection of the address fault in the memory 106.

The memory 106 may be coupled to the address fault detection system 104. The memory 106 may be configured to store various reference data and parity data. Further, the memory 106 may include the first memory block 106a and the second memory block 106b. Each of the first and second memory blocks 106a and 106b may include a dedicated address translator (not shown) and a storage element (not shown). The address translator translates (e.g., decodes) the received address (e.g., the second address ADD2), and data is written to or read from the storage element based on the translated address. Examples of the memory 106 may include a random-access memory (RAM), a read-only memory (ROM), or the like.

The memory 106 may be split into the plurality of memory blocks. In an embodiment, the memory 106 may be split in a horizontal manner. A memory size of the first memory block 106a may be equal to a memory size of the second memory block 106b. In an example, the memory 106 stores thirty-two data words. In such a scenario, when the memory 106 is split in a horizontal manner, the first memory block 106a may be configured to store sixteen data words, and the second memory block 106b may be configured to store sixteen data words. In an example, the memory 106 is shown to include two memory blocks (e.g., the first and second memory blocks 106a and 106b) to make the illustrations concise and clear and should not be considered as a limitation of the present disclosure. In various other embodiments, the memory 106 may include more than two memory blocks with each additional pair of memory blocks operating in a manner similar to that of the first and second memory blocks 106a and 106b.

The first memory block 106a may be configured to store the first reference data set RDS1 and the second memory block 106b may be configured to store the second reference data set RDS2. The first reference data set RDS1 may include the first reference data REF1 and the second reference data REF2, and the second reference data set RDS2 may include the third reference data REF3. Further, the second memory block 106b may be configured to store the first parity data set PDS1 that is associated with the first reference data set RDS1, respectively. The first parity data set PDS1 may include the first parity data PAR1 and the second parity data PAR2. Similarly, the first memory block 106a may be configured to store the second parity data set PDS2 that is associated with the second reference data set RDS2, respectively. The second parity data set PDS2 may include the third parity data PAR3. Further, at each address of the first memory block 106a, one reference data of the first reference data set RDS1 and one parity data of the second parity data set PDS2 are stored in a concatenated manner. For example, the second reference data REF2 and the third parity data PAR3 are stored in the first memory block 106a in a concatenated manner. Similarly, at each address of the second memory block 106b, one reference data of the second reference data set RDS2 and one parity data of the first parity data set PDS1 are stored in a concatenated manner. For example, the third reference data REF3 and the second parity data PAR2 are stored in the second memory block 106b in a concatenated manner.

In an example, each reference data of the first reference data set RDS1 and each parity data of the first parity data set PDS1 are written (e.g., stored) to the first and second memory blocks 106a and 106b, respectively, in a similar manner as described above. Further, each reference data of the second reference data set RDS2 and each parity data of the second parity data set PDS2 are written (e.g., stored) to the second and first memory blocks 106b and 106a, respectively, in a similar manner as described above.

The first memory block 106a may include a first plurality of pins of which a first set of parity pins PP1, a first set of data pins DP1, a first set of enable pins EP1, a second set of enable pins EP2, and a first set of address pins AP1 are shown. Similarly, the second memory block 106b may include a second plurality of pins of which a second set of address pins AP2, a third set of enable pins EP3, a fourth set of enable pins EP4, a second set of data pins DP2, and a second set of parity pins PP2 are shown. The first and fourth sets of enable pins EP1 and EP4 may be associated with the reference data storage in the first and second memory blocks 106a and 106b, respectively. Similarly, the second and third sets of enable pins EP2 and EP3 may be associated with the parity data storage in the first and second memory blocks 106a and 106b, respectively. In an example, a number of address bits of the first set of address bits is ten. Thus, the first and second sets of address pins AP1 and AP2 include ten pins each. Further, each reference data of the first and second reference data sets RDS1 and RDS2 is sixty-four-bit data and each parity data of the first and second parity data sets PDS1 and PDS2 is eight-bit data. Thus, the first and second sets of data pins DP1 and DP2 include sixty-four pins each, and the first and second sets of parity pins PP1 and PP2 include eight pins each. Further, the first and fourth sets of enable pins EP1 and EP4 include sixty-four pins each, and the second and third sets of enable pins EP2 and EP3 include eight pins each.

Write Operation:

When the write operation is initiated with the memory 106, the address fault detection system 104 may provide the second address ADD2 (e.g., the first set of address bits) to the first and second memory blocks 106a and 106b by way of the first and second sets of address pins AP1 and AP2, respectively. For example, the ten address bits of the second address ADD2 are provided to the ten pins of each of the first and second sets of address pins AP1 and AP2, respectively. Further, the address fault detection system 104 may provide the first and second address bits AB1 and AB2 to the first memory block 106a by way of the first and second sets of enable pins EP1 and EP2, respectively. For example, the first address bit AB1 is provided to each of the sixty-four pins of the first set of enable pins EP1, and the second address bit AB2 is provided to each of the eight pins of the second set of enable pins EP2. Similarly, the address fault detection system 104 may provide the first and second address bits AB1 and AB2 to the second memory block 106b by way of the third and fourth sets of enable pins EP3 and EP4, respectively. For example, the first address bit AB1 is provided to each of the eight pins of the third set of enable pins EP3, and the second address bit AB2 is provided to each of the sixty-four pins of the fourth set of enable pins EP4.

When the first address bit AB1 is activated (e.g., is at a logic high state), the reference data storage in the first memory block 106a and the parity data storage in the second memory block 106b are selected. Conversely, when the first address bit AB1 is deactivated (e.g., is at a logic low state), the parity data storage in the first memory block 106a and the reference data storage in the second memory block 106b are selected. For the sake of ongoing discussion, it is assumed that the first address bit AB1 is activated.

The address fault detection system 104 may be configured to write the first reference data REF1 at the second address ADD2 of the first memory block 106a by way of the first set of data pins DP1. For example, the sixty-four bits of the first reference data REF1 are provided to the sixty-four pins of the first set of data pins DP1, respectively. The address fault detection system 104 may be further configured to write the first parity data PAR1 at the second address ADD2 of the second memory block 106b by way of the second set of parity pins PP2. For example, the eight bits of the first parity data PAR1 are provided to the eight pins of the second set of parity pins PP2, respectively. The first reference data set RDS1, the second reference data set RDS2, the first parity data set PDS1, and the second parity data set PDS2 are written to the memory 106 in a similar manner as described above.

Read Operation:

When the read operation is initiated with the memory 106, the address fault detection system 104 may provide the second address ADD2 (e.g., the first set of address bits) to the first and second memory blocks 106a and 106b by way of the first and second sets of address pins AP1 and AP2, respectively. Further, the address fault detection system 104 may receive, based on the second address ADD2, the second reference data REF2 and the third parity data PAR3 from the first memory block 106a by way of the first set of data pins DP1 and the first set of parity pins PP1, respectively. For example, the sixty-four bits of the second reference data REF2 are received by the address fault detection system 104 from the sixty-four pins of the first set of data pins DP1, respectively. Further, the eight bits of the third parity data PAR3 are received by the address fault detection system 104 from the eight pins of the first set of parity pins PP1, respectively. The second reference data REF2 and the third parity data PAR3 are stored in the first memory block 106a in a concatenated manner.

The address fault detection system 104 may similarly receive, based on the second address ADD2, the third reference data REF3 and the second parity data PAR2 from the second memory block 106b by way of the second set of data pins DP2 and the second set of parity pins PP2, respectively. For example, the sixty-four bits of the third reference data REF3 are received by the address fault detection system 104 from the sixty-four pins of the second set of data pins DP2, respectively. Further, the eight bits of the second parity data PAR2 are received by the address fault detection system 104 from the eight pins of the second set of parity pins PP2, respectively. The third reference data REF3 and the second parity data PAR2 are stored in the second memory block 106b in a concatenated manner. Further, the address fault may be detected in the memory 106 based on the second reference data REF2, the third reference data REF3, the second parity data PAR2, the third parity data PAR3, the first address bit AB1, and the second address bit AB2 as described above.

Variations in the IC 100 of FIG. 1:

In a first variation, the first and second reference data sets RDS1 and RDS2 and the first and second parity data sets PDS1 and PDS2 may be stored in the memory 106 during fabrication of the memory 106 instead of being written to the memory 106 based on various write operations initiated by functional circuits (such as the functional circuit 102).

In a second variation, the memory 106 may be split in a vertical manner instead of a horizontal manner. When the memory 106 is split in a vertical manner, if the memory 106 stores thirty-two data words, the first memory block 106a may be configured to store thirty-two data bytes and the second memory block 106b may be configured to store thirty-two data bytes. Further, the address fault detection system 104 may operate in a similar manner as described above.

Figure 2:
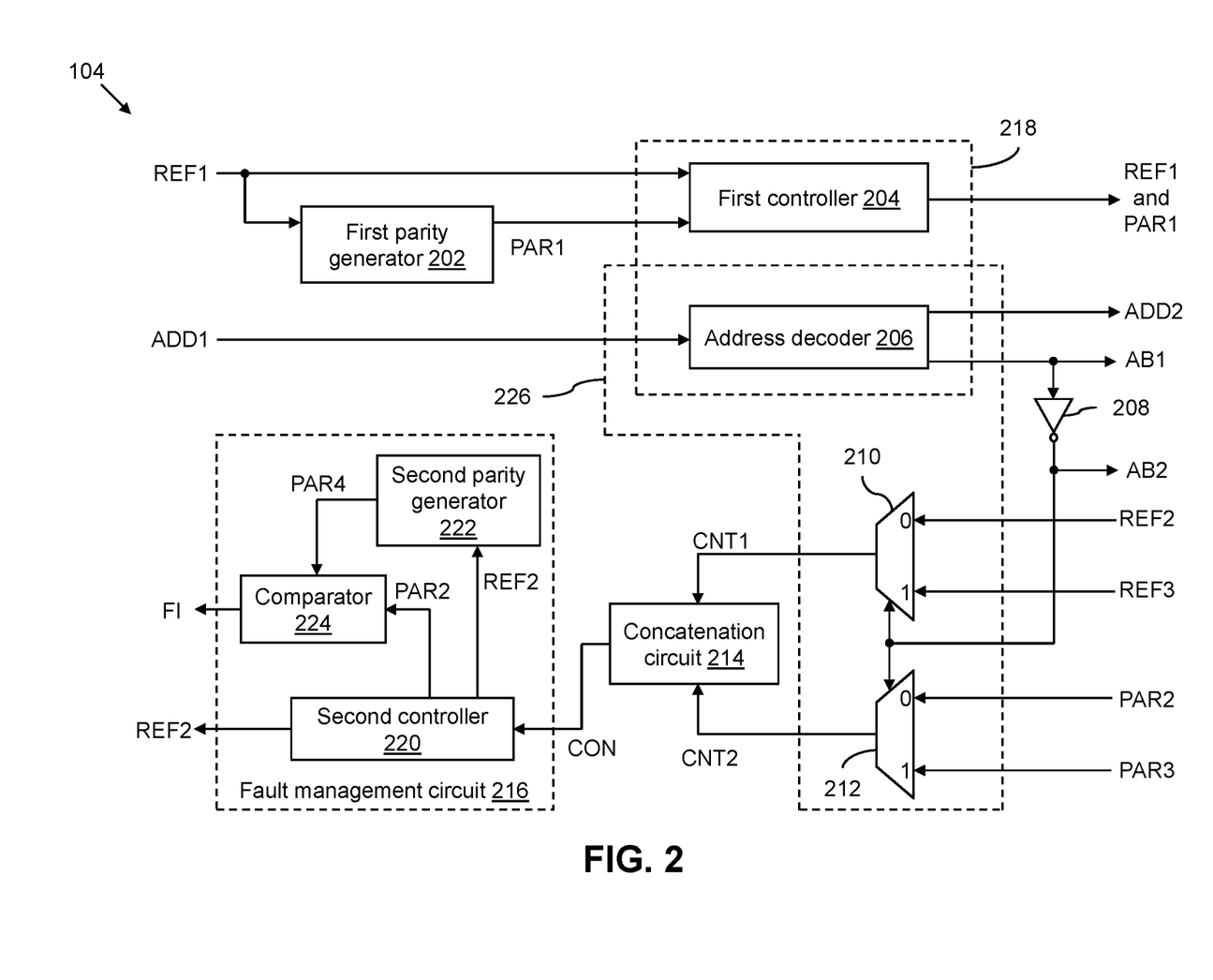
FIG. 2 illustrates a schematic block diagram of an address fault detection system of the IC of FIG. 1 in accordance with an embodiment of the present disclosure.

FIG. 2 illustrates a schematic block diagram of the address fault detection system 104 in accordance with an embodiment of the present disclosure. The address fault detection system 104 may include a first parity generator 202, a first controller 204, an address decoder 206, an inverter 208, a first multiplexer 210, a second multiplexer 212, a concatenation circuit 214, and a fault management circuit 216.

The following table illustrates various data described in FIG. 2:

| Data | Description |
| --- | --- |
| First control data CNT1 | One of the second and third reference data REF2 and REF3 selected by the first multiplexer 210 |
| Second control data CNT2 | One of the second and third parity data PAR2 and PAR3 selected by the second multiplexer 212 |
| Concatenated data CON | Generated by concatenating the first and second control data CNT1 and CNT2 |
| Fourth parity data PAR4 | Parity data generated based on the first control data CNT1 (e.g., one of the second and third reference data REF2 and REF3) |

The first parity generator 202 may be coupled to the functional circuit 102. The first parity generator 202 may include suitable circuitry that may be configured to perform one or more operations. For example, the first parity generator 202 may be configured to receive, from the functional circuit 102, the first reference data REF1 for the write operation associated with the memory 106. The first parity generator 202 may be further configured to generate the first parity data PAR1 based on the first reference data REF1. Similarly, the first parity generator 202 may be configured to receive the first and second reference data sets RDS1 and RDS2 and generate the first and second parity data sets PDS1 and PDS2 based on the first and second reference data sets RDS1 and RDS2, respectively. In an embodiment, the first parity generator 202 corresponds to an ECC generator. Further, the first parity generator 202 is non-operational during the read operation associated with the memory 106.

The first controller 204 may be coupled to the functional circuit 102, the first parity generator 202, and the first and second memory blocks 106a and 106b. The first controller 204 may include suitable circuitry that may be configured to perform one or more operations. For example, when the write operation is initiated with the memory 106 by the functional circuit 102, the first controller 204 may be configured to receive the first parity data PAR1 and the first reference data REF1 from the first parity generator 202 and the functional circuit 102, respectively. The first controller 204 may be further configured to write the first reference data REF1 and the first parity data PAR1 to the memory 106. Specifically, the first controller 204 may write the first reference data REF1 and the first parity data PAR1 at the second address ADD2 of the first and second memory blocks 106a and 106b, respectively. The first controller 204 may write the first reference data REF1 and the first parity data PAR1 to the first and second memory blocks 106a and 106b by way of the first set of data pins DP1 and the second set of parity pins PP2, respectively. Similarly, the first controller 204 may be configured to write the first reference data set RDS1 and the first parity data set PDS1 to the first and second memory blocks 106a and 106b, respectively. The first controller 204 may be further configured to write the second reference data set RDS2 and the second parity data set PDS2 to the second and first memory blocks 106b and 106a, respectively. Further, the first controller 204 is non-operational during the read operation associated with the memory 106.

The address decoder 206 may be coupled to the functional circuit 102 and the first and second memory blocks 106a and 106b. The address decoder 206 may include suitable circuitry that may be configured to perform one or more operations. For example, the address decoder 206 may be configured to receive the first address ADD1 from the functional circuit 102. The first address ADD1 may be associated with the write operation or the read operation initiated with the memory 106 by the functional circuit 102. The address decoder 206 may be further configured to decode the first address ADD1 to extract the first set of address bits and the first address bit AB1. The first set of address bits is indicative of the second address ADD2. Further, the address decoder 206 may be configured to provide the second address ADD2 to the first and second memory blocks 106a and 106b by way of the first and second sets of address pins AP1 and AP2, respectively. The address decoder 206 may be further configured to provide the first address bit AB1 to the first and second memory blocks 106a and 106b by way of the first and third sets of enable pins EP1 and EP3, respectively. The operation of the address decoder 206 remains the same during the read and write operations initiated with the memory 106 by the functional circuit 102.

The inverter 208 may be coupled to the address decoder 206 and the memory 106 (e.g., the first and second memory blocks 106a and 106b). The inverter 208 may be configured to receive the first address bit AB1 from the address decoder 206, and output the second address bit AB2 that is the inverted version of the first address bit AB1. The inverter 208 may be further configured to provide the second address bit AB2 to the first and second memory blocks 106a and 106b by way of the second and fourth sets of enable pins EP2 and EP4, respectively. Additionally, the inverter 208 may be configured to provide the second address bit AB2 to the first and second multiplexers 210 and 212. The second address bit AB2 provided to the first and second memory blocks 106a and 106b is utilized during the write operation. Further, the second address bit AB2 provided to the first and second multiplexers 210 and 212 is utilized during the read operation.

The first parity generator 202, the first controller 204, the address decoder 206, and the inverter 208 thus facilitate the write operation with the memory 106. Further, the first controller 204 and the address decoder 206 may be collectively referred to as a "write access circuit 218". Thus, the write access circuit 218 may be coupled to the functional circuit 102, the first parity generator 202, and the memory 106 (e.g., the first and second memory blocks 106a and 106b). The write access circuit 218 may be configured to receive the first address ADD1 and the first reference data REF1 associated with the write operation from the functional circuit 102. Further, the write access circuit 218 may be configured to receive the first parity data PAR1 from the first parity generator 202. Based on the first address ADD1, the write access circuit 218 may be further configured to write the first reference data REF1 and the first parity data PAR1 to the first and second memory blocks 106a and 106b, respectively. Specifically, the write access circuit 218 may write the first reference data REF1 and the first parity data PAR1 at the second address ADD2 of the first and second memory blocks 106a and 106b, respectively.

The write access circuit 218 may write the first reference data REF1 and the first parity data PAR1 to the first and second memory blocks 106a and 106b by way of the first set of data pins DP1 and the second set of parity pins PP2, respectively. Further, to write the first reference data REF1 to the first memory block 106a, the write access circuit 218 may be configured to provide the second address ADD2 to the first memory block 106a by way of the first set of address pins AP1. Similarly, to write the first parity data PAR1 to the second memory block 106b, the write access circuit 218 may be further configured to provide the second address ADD2 to the second memory block 106b by way of the second set of address pins AP2. Additionally, the write access circuit 218 may be configured to provide the first address bit AB1 to the first and second memory blocks 106a and 106b by way of the first and third sets of enable pins EP1 and EP3, respectively. The inverter 208 may be similarly configured to provide the second address bit AB2 to the first and second memory blocks 106a and 106b by way of the second and fourth sets of enable pins EP2 and EP4, respectively. The address fault may be detected in the memory 106 based on the first reference data REF1 and the first parity data PAR1 written to the first memory block 106a and the second memory block 106b, respectively.

The write access circuit 218 may be similarly configured to receive the first set of addresses and a second set of addresses (not shown) for the first and second sets of write operations associated with the memory 106, respectively, the first and second reference data sets RDS1 and RDS2, and the first and second parity data sets PDS1 and PDS2. Further, the write access circuit 218 may be configured to write, based on the first set of addresses, the first reference data set RDS1 and the first parity data set PDS1 to the first and second memory blocks 106a and 106b, respectively. Similarly, the write access circuit 218 may be further configured to write, based on the second set of addresses, the second reference data set RDS2 and the second parity data set PDS2 to the second and first memory blocks 106b and 106a, respectively.

The first multiplexer 210 has a first input terminal, a second input terminal, a control terminal, and an output terminal. The first and second input terminals of the first multiplexer 210 may be coupled to the first and second memory blocks 106a and 106b, respectively. The first and second input terminals of the first multiplexer 210 may be configured to receive the second reference data REF2 and the third reference data REF3 from the first and second memory blocks 106a and 106b by way of the first and second sets of data pins DP1 and DP2, respectively. The second reference data REF2 and the third reference data REF3 are received in response to the second address ADD2 for the read operation provided to the first and second memory blocks 106a and 106b by the address decoder 206, respectively.

The control terminal of the first multiplexer 210 may be coupled to the inverter 208. The control terminal of the first multiplexer 210 may be configured to receive the second address bit AB2 from the inverter 208. Based on the second address bit AB2, the output terminal of the first multiplexer 210 may be configured to output one of the second reference data REF2 and the third reference data REF3 as first control data CNT1. In an embodiment, when the second address bit AB2 is deactivated (e.g., is at a logic low state), the output terminal of the first multiplexer 210 may output the second reference data REF2 as the first control data CNT1. Similarly, when the second address bit AB2 is activated (e.g., is at a logic high state), the output terminal of the first multiplexer 210 may output the third reference data REF3 as the first control data CNT1.

The second multiplexer 212 has a first input terminal, a second input terminal, a control terminal, and an output terminal. The first and second input terminals of the second multiplexer 212 may be coupled to the second and first memory blocks 106b and 106a, respectively. Further, the first and second input terminals of the second multiplexer 212 may be configured to receive the second parity data PAR2 and the third parity data PAR3 from the second and first memory blocks 106b and 106a, respectively. The first and second input terminals of the second multiplexer 212 may receive the second parity data PAR2 and the third parity data PAR3 from the second and first memory blocks 106b and 106a by way of the second and first sets of parity pins PP2 and PP1, respectively. The second parity data PAR2 and the third parity data PAR3 are received in response to the second address ADD2 for the read operation provided to the second and first memory blocks 106b and 106a by the address decoder 206, respectively. In other words, the second reference data REF2 and the third parity data PAR3 may be stored at the second address ADD2 of the first memory block 106a. Further, the third reference data REF3 and the second parity data PAR2 may be stored at the second address ADD2 of the second memory block 106b.

The control terminal of the second multiplexer 212 may be coupled to the inverter 208. The control terminal of the second multiplexer 212 may be configured to receive the second address bit AB2 from the inverter 208. Based on the second address bit AB2, the output terminal of the second multiplexer 212 may be configured to output one of the second parity data PAR2 and the third parity data PAR3 as second control data CNT2. In an embodiment, when the second address bit AB2 is deactivated (e.g., is at a logic low state), the output terminal of the second multiplexer 212 may output the second parity data PAR2 as the second control data CNT2. Similarly, when the second address bit AB2 is activated (e.g., is at a logic high state), the output terminal of the second multiplexer 212 may output the third parity data PAR3 as the second control data CNT2.

The concatenation circuit 214 may be coupled to the output terminals of the first and second multiplexers 210 and 212 and the fault management circuit 216. The concatenation circuit 214 may include suitable circuitry that may be configured to perform one or more operations. For example, the concatenation circuit 214 may be configured to receive the first control data CNT1 and the second control data CNT2 from the output terminals of the first and second multiplexers 210 and 212, respectively. The concatenation circuit 214 may be further configured to concatenate the first control data CNT1 and the second control data CNT2 to generate concatenated data CON. The concatenation circuit 214 may concatenate the first control data CNT1 and the second control data CNT2 such that concatenated data CON includes the second reference data REF2 and the second parity data PAR2 when the first address bit AB1 is activated and the second address bit AB2 is deactivated. Further, the concatenation circuit 214 may be configured to provide the concatenated data CON to the fault management circuit 216. The concatenation circuit 214 is non-operational during the write operation associated with the memory 106.

Although the address fault detection system 104 is illustrated to include the concatenation circuit 214, the scope of the present disclosure is not limited to it. In various other embodiments, the address fault detection system 104 may be sans the concatenation circuit 214, without deviating from the scope of the present disclosure. In such a scenario, the output terminals of the first and second multiplexers 210 and 212 may be configured to provide the first and second control data CNT1 and CNT2 to the fault management circuit 216, respectively.

The fault management circuit 216 may be coupled to the concatenation circuit 214 and the functional circuit 102. The fault management circuit 216 may be configured to receive the concatenated data CON from the concatenation circuit 214. Further, the fault management circuit 216 may be configured to generate the fourth parity data (hereinafter referred to and designated as the "fourth parity data PAR4") based on the second reference data REF2. The fault management circuit 216 may be further configured to compare the second parity data PAR2 and the fourth parity data PAR4 to detect the address fault in the memory 106. Further, the fault management circuit 216 may be configured to generate the fault indication signal FI that is indicative of the detected address fault. In an embodiment, when the fourth parity data PAR4 matches the second parity data PAR2, the fault indication signal FI is deactivated (e.g., is at a logic low state) to indicate absence of the address fault in the memory 106. Further, when the fourth parity data PAR4 does not match the second parity data PAR2, the fault indication signal FI is activated (e.g., is at a logic high state) to indicate presence of the address fault in the memory 106 (e.g., at least one of the first and second memory blocks 106a and 106b). The fault management circuit 216 may be further configured to provide the fault indication signal FI and the second reference data REF2 to the functional circuit 102. The fault management circuit 216 is non-operational during the write operation associated with the memory 106.

The address fault may be associated with the dedicated address translator of at least one of the first and second memory blocks 106a and 106b. The faulty address translator may lead to at least one of the first and second memory blocks 106a and 106b outputting data (e.g., reference data or parity data) stored at a different address than that received by way of the respective address pins (e.g., the first and second sets of address pins AP1 and AP2). The fault management circuit 216 may include a second controller 220, a second parity generator 222, and a comparator 224.

The second controller 220 may be coupled to the concatenation circuit 214, the second parity generator 222, the comparator 224, and the functional circuit 102. Further, the second controller 220 may be coupled to the first and second multiplexers 210 and 212 by way of the concatenation circuit 214. The second controller 220 may include suitable circuitry that may be configured to perform one or more operations. For example, the second controller 220 may be configured to receive the concatenated data CON from the concatenation circuit 214. The concatenated data CON may include the second reference data REF2 and the second parity data PAR2 when the first address bit AB1 is activated. The second controller 220 may be further configured to provide the second reference data REF2 to the second parity generator 222 and the second parity data PAR2 to the comparator 224. Further, the second controller 220 may be configured to provide the second reference data REF2 to the functional circuit 102.

The second parity generator 222 may be coupled to the second controller 220 and the comparator 224. The second parity generator 222 may include suitable circuitry that may be configured to perform one or more operations. For example, the second parity generator 222 may be configured to receive the second reference data REF2 from the second controller 220. The second parity generator 222 may be further configured to generate the fourth parity data PAR4 based on the second reference data REF2. In an embodiment, the second parity generator 222 corresponds to an ECC generator. Further, the second parity generator 222 may be configured to provide the fourth parity data PAR4 to the comparator 224.

The comparator 224 may be coupled to the second controller 220, the second parity generator 222, and the functional circuit 102. The comparator 224 may include suitable circuitry that may be configured to perform one or more operations. For example, the comparator 224 may be configured to receive the second parity data PAR2 and the fourth parity data PAR4 from the second controller 220 and the second parity generator 222, respectively. The comparator 224 may be further configured to compare the second parity data PAR2 and the fourth parity data PAR4 to detect the address fault in the memory 106. Based on a result of the comparison, the comparator 224 may be further configured to generate the fault indication signal FI indicative of the detected address fault. The fault indication signal FI may be deactivated when the fourth parity data PAR4 matches the second parity data PAR2. In other words, the fault indication signal FI may be deactivated when the address fault is absent in the memory 106. Further, the fault indication signal FI may be activated when the fourth parity data PAR4 does not match the second parity data PAR2. In other words, the fault indication signal FI may be activated when the address fault is detected in the memory 106. The comparator 224 may be further configured to provide the fault indication signal FI to the functional circuit 102.

The address decoder 206, the inverter 208, the first and second multiplexers 210 and 212, the concatenation circuit 214, and the fault management circuit 216 thus facilitate the read operation with the memory 106 and the detection of the address fault in the memory 106. Further, the address decoder 206 and the first and second multiplexers 210 and 212 may be collectively referred to as a "read access circuit 226". Thus, the read access circuit 226 may be coupled to the functional circuit 102, the first and second memory blocks 106a and 106b, the inverter 208, and the concatenation circuit 214. Further, the read access circuit 226 may be coupled to the fault management circuit 216 by way of the concatenation circuit 214.

The read access circuit 226 may be configured to receive the first address ADD1 from the functional circuit 102, and decode the first address ADD1 to extract the first set of address bits and the first address bit AB1. The first set of address bits is indicative of the second address ADD2. Further, the read access circuit 226 may be configured to provide the second address ADD2 to the first and second memory blocks 106a and 106b. The read access circuit 226 may provide the second address ADD2 to the first and second memory blocks 106a and 106b by way of the first and second sets of address pins AP1 and AP2, respectively. Further, the read access circuit 226 may provide the first address bit AB1 to the inverter 208 and receive the second address bit AB2 from the inverter 208.

The read access circuit 226 may be configured to receive, as a response to the second address ADD2, the second reference data REF2 and the third parity data PAR3 from the first memory block 106a and the third reference data REF3 and the second parity data PAR2 from the second memory block 106b. The second reference data REF2 and the third parity data PAR3 may be stored at the second address ADD2 of the first memory block 106a. Further, the third reference data REF3 and the second parity data PAR2 may be stored at the second address ADD2 of the second memory block 106b.

The read access circuit 226 may receive the second reference data REF2 and the third parity data PAR3 from the first memory block 106a by way of the first set of data pins DP1 and the first set of parity pins PP1, respectively. Similarly, the read access circuit 226 may receive the third reference data REF3 and the second parity data PAR2 from the second memory block 106b by way of the second set of data pins DP2 and the second set of parity pins PP2, respectively. Further, based on the second address bit AB2, one of the second reference data REF2 and the third reference data REF3 and one of the second parity data PAR2 and the third parity data PAR3 are selected. As the first address bit AB1 is activated, the second address bit AB2 is deactivated. Hence, the second reference data REF2 and the second parity data PAR2 are selected. In other words, the read access circuit 226 may be configured to read, based on the first address ADD1, the second reference data REF2 of the first reference data set RDS1 from the first memory block 106a, and the second parity data PAR2 of the first parity data set PDS1 from the second memory block 106b.

Although not shown, the write access circuit 218 and the read access circuit 226 may additionally include a first selection circuit and a second selection circuit, respectively. Each of the first and second selection circuits may receive a select signal (not shown). The write access circuit 218 may write, by way of the first selection circuit, the first reference data REF1 and the first parity data PAR1 to the first and second memory blocks 106a and 106b, respectively, when the select signal is activated (e.g., is at a logic high state). Similarly, the read access circuit 226 may read, by way of the second selection circuit, the second reference data REF2 and the second parity data PAR2 from the first and second memory blocks 106a and 106b, respectively, when the select signal is activated.

Figure 3A:
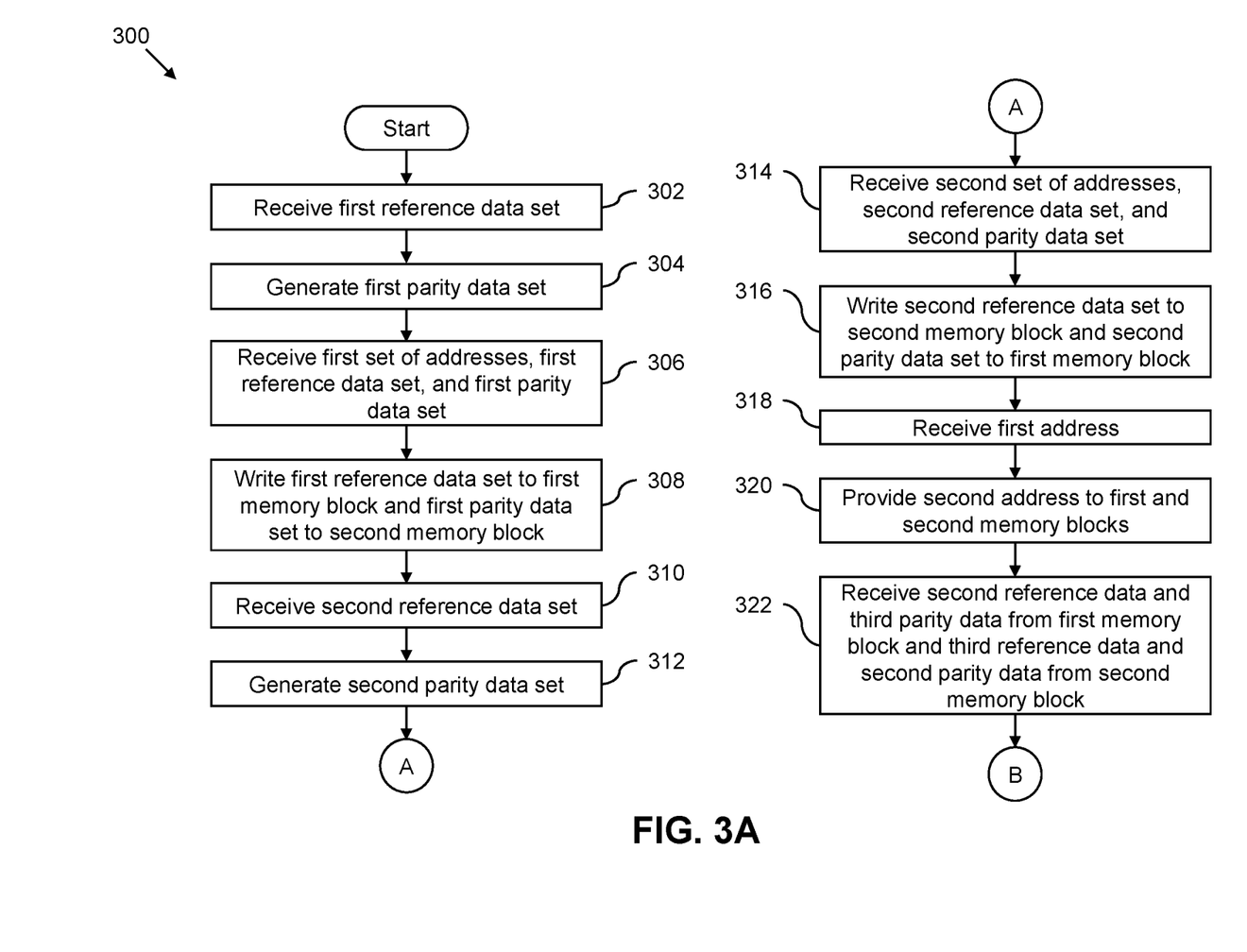
FIGS. 3A and 3B, collectively, represents a flowchart that illustrates a method for detecting address faults in a memory of the IC of FIG. 1 in accordance with an embodiment of the present disclosure.
Figure 3B:
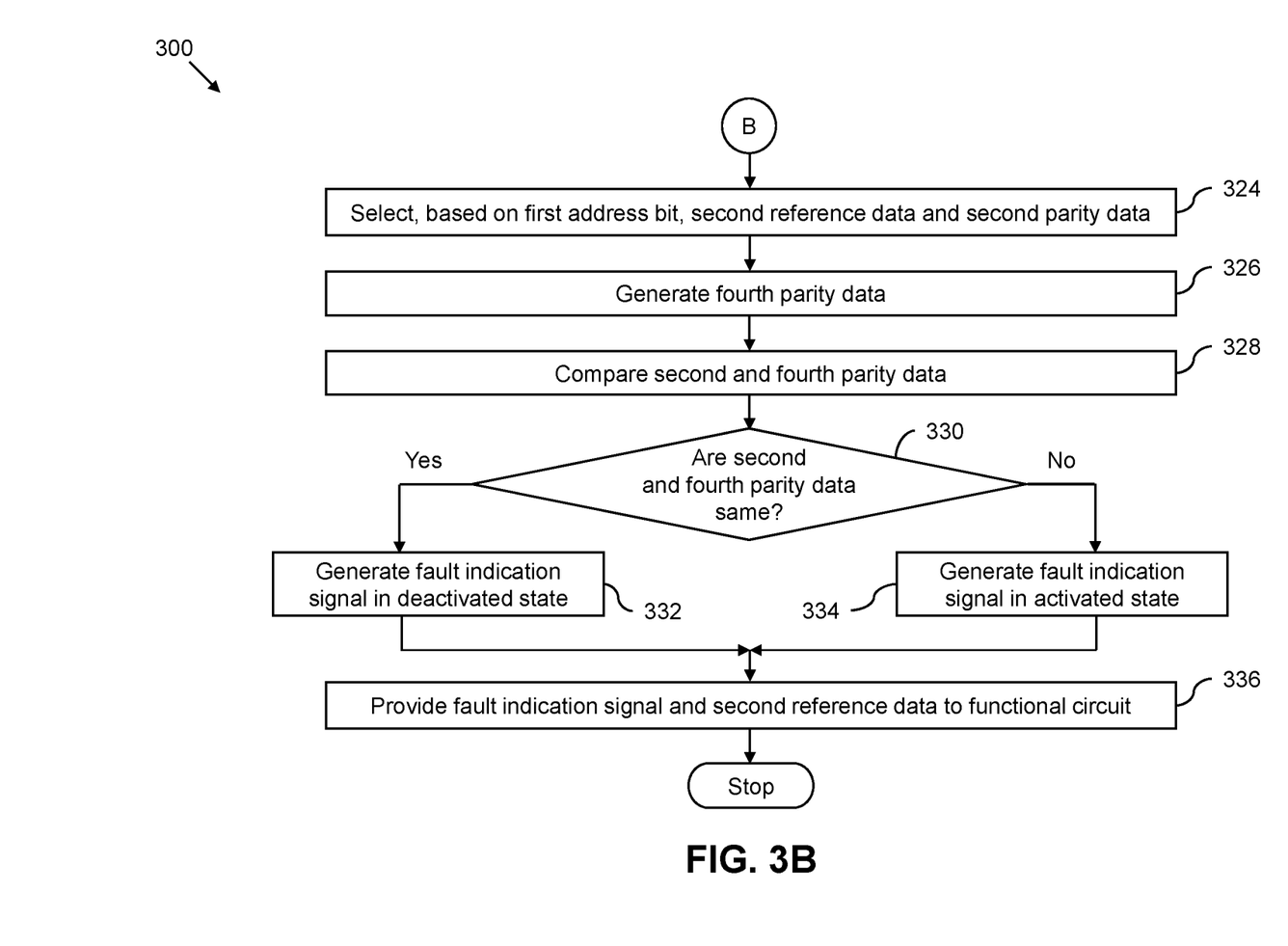

FIGS. 3A and 3B, collectively, represents a flowchart 300 that illustrates a method for detecting address faults in the memory 106 in accordance with an embodiment of the present disclosure. The functional circuit 102 may initiate the first set of write operations with the memory 106 and generate the first reference data set RDS1 and the first set of addresses based on the initiation of the first set of write operations. The first reference data set RDS1 includes the first reference data REF1 and the first set of addresses includes the first address ADD1. Similarly, the functional circuit 102 may initiate the second set of write operations with the memory 106 and generate the second reference data set RDS2 and the second set of addresses based on the initiation of the second set of write operations.

Referring now to FIG. 3A, at step 302, the first parity generator 202 may receive the first reference data set RDS1 from the functional circuit 102. At step 304, the first parity generator 202 may generate the first parity data set PDS1 based on the first reference data set RDS1, respectively. At step 306, the write access circuit 218 may receive the first set of addresses and the first reference data set RDS1 from the functional circuit 102 and the first parity data set PDS1 from the first parity generator 202. At step 308, the write access circuit 218 may write the first reference data set RDS1 to the first memory block 106a and the first parity data set PDS1 to the second memory block 106b.

At step 310, the first parity generator 202 may receive the second reference data set RDS2 from the functional circuit 102. At step 312, the first parity generator 202 may generate the second parity data set PDS2 based on the second reference data set RDS2, respectively. At step 314, the write access circuit 218 may receive the second set of addresses and the second reference data set RDS2 from the functional circuit 102 and the second parity data set PDS2 from the first parity generator 202. At step 316, the write access circuit 218 may write the second reference data set RDS2 to the second memory block 106b and the second parity data set PDS2 to the first memory block 106a. At each address of the first memory block 106a, one reference data of the first reference data set RDS1 and one parity data of the second parity data set PDS2 are stored in a concatenated manner. Similarly, at each address of the second memory block 106b, one reference data of the second reference data set RDS2 and one parity data of the first parity data set PDS1 are stored in a concatenated manner.

To detect the address fault in the memory 106, the functional circuit 102 initiates the read operation associated with the memory 106. The functional circuit 102 generates the first address ADD1 for the read operation. At step 318, the read access circuit 226 may receive the first address ADD1 from the functional circuit 102. At step 320, the read access circuit 226 may provide the second address ADD2 to the first and second memory blocks 106a and 106b by way of the first and second sets of address pins AP1 and AP2, respectively. At step 322, the read access circuit 226 may receive, in response to the second address ADD2, the second reference data REF2 and the third parity data PAR3 from the first memory block 106a, and the third reference data REF3 and the second parity data PAR2 from the second memory block 106b. The second and third reference data REF2 and REF3 may be received at the first and second input terminals of the first multiplexer 210 by way of the first and second sets of data pins DP1 and DP2, respectively. The second and third parity data PAR2 and PAR3 may be received at the first and second input terminals of the second multiplexer 212 by way of the second and first sets of parity pins PP2 and PP1, respectively.

Referring now to FIG. 3B, at step 324, the read access circuit 226 may select, based on the activated state of the first address bit AB1, the second reference data REF2 and the second parity data PAR2. The first multiplexer 210 selects and outputs the second reference data REF2 as the first control data CNT1 and the second multiplexer 212 selects and outputs the second parity data PAR2 as the second control data CNT2. At step 326, the fault management circuit 216 may generate the fourth parity data PAR4 based on the second reference data REF2. At step 328, the fault management circuit 216 may compare the second parity data PAR2 and the fourth parity data PAR4 to detect the address fault in the memory 106.

At step 330, the fault management circuit 216 may determine whether the second and fourth parity data PAR2 and PAR4 are same. If at step 330, the fault management circuit 216 determines that the second and fourth parity data PAR2 and PAR4 are same, step 332 is performed. At step 332, the fault management circuit 216 may generate the fault indication signal FI in a deactivated state, and then step 336 is performed. The fault indication signal FI in a deactivated state indicates that the address fault is absent in the memory 106. In other words, the second reference data REF2 and the second parity data PAR2 are stored at the second address ADD2 of the first and second memory blocks 106a and 106b, respectively. If at step 330, the fault management circuit 216 determines that the second and fourth parity data PAR2 and PAR4 are different, step 334 is performed. At step 334, the fault management circuit 216 may generate the fault indication signal FI in an activated state. The fault indication signal FI in an activated state indicates that the address fault is present in the memory 106 (e.g., in at least one of the first and second memory blocks 106a and 106b). In other words, at least one of the second reference data REF2 and the second parity data PAR2 is not stored at the second address ADD2 of the first and second memory blocks 106a and 106b, respectively. Thus, at least one of the first and second memory blocks 106a and 106b output data stored at a different address than the second address ADD2.

At step 336, the fault management circuit 216 may provide the fault indication signal FI and the second reference data REF2 to the functional circuit 102. When the fault indication signal FI is deactivated, the functional circuit 102 performs the one or more functional operations associated therewith based on the second reference data REF2. Conversely, when the fault indication signal FI is activated, the second reference data REF2 is discarded.

The address fault detection system 104 of the present disclosure thus writes the reference data (e.g., the first reference data REF1) and the parity data (e.g., the first parity data PAR1) to separate memory blocks (e.g., the first and second memory blocks 106a and 106b) of the memory 106 to facilitate the detection of the address faults. As a result, the reliability of the IC 100 significantly increases.

The address fault detection system 104 of the present disclosure detects the address fault in the memory 106 based on the parity data (e.g., the first parity data PAR1) that is generated exclusively based on the reference data (e.g., the first reference data REF1). In other words, the parity data is generated sans an address (e.g., the first address ADD1) associated with the read and write operations. Hence, the parity generators (e.g., the first and second parity generators 202 and 222) of the address fault detection system 104 do not add any delay during the read and write operations. As a result, a time required for the address fault detection system 104 to perform the read and write operations is significantly less than that required for the conventional address fault detection system. In the conventional address fault detection system, parity data is generated based on reference data as well as the address associated with read and write operations, and hence, results in the introduction of a delay in the execution of the read and write operations. Further, as the parity data is generated sans an address, a need to implement various circuitries in the first and second parity generators 202 and 222 for generating parity data based on the address is eliminated. As a result, a design complexity and a size of the address fault detection system 104 are significantly less than that of the conventional address fault detection system. Consequently, a design complexity and a size of the IC 100 including the address fault detection system 104 are significantly less than that of an IC including the conventional address fault detection system.

The term "coupled," as used herein, is not intended to be limited to a direct coupling or a mechanical coupling. Furthermore, the terms "a" or "an," as used herein, are defined as one or more than one.

While various embodiments of the present disclosure have been illustrated and described, it will be clear that the present disclosure is not limited to these embodiments only.

Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit (IC), comprising:
a memory that comprises a first memory block and a second memory block, wherein the first memory block is configured to store a first reference data set, and the second memory block is configured to store a first parity data set that is associated with the first reference data set, respectively; and
an address fault detection system that is coupled to the memory, wherein the address fault detection system comprises:
a read access circuit that is coupled to the memory, and configured to receive a first address for a read operation associated with the memory, and read, based on the first address, first reference data of the first reference data set from the first memory block and first parity data of the first parity data set from the second memory block; and
a fault management circuit that is coupled to the read access circuit, and configured to receive the first reference data and the first parity data, generate second parity data based on the first reference data, and compare the first parity data and the second parity data to detect an address fault in the memory;
wherein the first address comprises (i) a first address bit that corresponds to a most significant bit of the first address, and (ii) a first set of address bits that is indicative of a second address of the first and second memory blocks; and
wherein to read the first reference data and the first parity data from the first and second memory blocks, respectively, the read access circuit is further configured to:
provide the second address to each of the first and second memory blocks; and
receive the first reference data and third parity data as a response from the first memory block, and second reference data and the first parity data as a response from the second memory block, wherein based on the first address bit, the first reference data and the first parity data are read from the first and second memory blocks, respectively.

2. The IC of claim 1, further comprising a functional circuit that is configured to initiate the read operation, wherein the fault management circuit is further coupled to the functional circuit, and configured to:
generate a fault indication signal that is indicative of the detected address fault, wherein when the first parity data matches the second parity data, the fault indication signal is deactivated to indicate absence of the address fault in the memory, and wherein when the first parity data does not match the second parity data, the fault indication signal is activated to indicate presence of the address fault in the memory; and
provide the fault indication signal and the first reference data to the functional circuit.

3. The IC of claim 2, wherein the fault management circuit comprises:

a controller that is coupled to the read access circuit and the functional circuit, and configured to receive the first reference data and the first parity data;
a parity generator that is coupled to the controller, and configured to receive the first reference data and generate the second parity data based on the first reference data; and
a comparator that is coupled to the controller, the parity generator, and the functional circuit, and configured to receive the first parity data and the second parity data, compare the first parity data and the second parity data to detect the address fault in the memory, and generate the fault indication signal indicative of the detected address fault, wherein the controller and the comparator are further configured to provide the first reference data and the fault indication signal to the functional circuit, respectively.

4. The IC of claim 1, wherein the first reference data is stored at the second address of the first memory block, and the first parity data is stored at the second address of the second memory block when the address fault is absent in the memory.

5. The IC of claim 1, wherein the second memory block is further configured to store a second reference data set, and the first memory block is further configured to store a second parity data set that is associated with the second reference data set, respectively, and wherein the second reference data set comprises the second reference data, and the second parity data set comprises the third parity data.

6. The IC of claim 1, wherein the first reference data and the third parity data are stored in the first memory block in a concatenated manner, and the second reference data and the first parity data are stored in the second memory block in a concatenated manner.

7. The IC of claim 1, wherein the read access circuit comprises an address decoder that is coupled to the first and second memory blocks, and configured to receive the first address, decode the first address to extract the second address, and provide the second address to each of the first and second memory blocks.

8. The IC of claim 1, wherein the read access circuit further comprises:
a first multiplexer that has (i) a first input terminal coupled to the first memory block, and configured to receive the first reference data, (ii) a second input terminal coupled to the second memory block, and configured to receive the second reference data, (iii) a control terminal configured to receive a second address bit that is an inverted version of the first address bit, and (iv) an output terminal configured to output, based on the second address bit, one of the first reference data and the second reference data as first control data; and
a second multiplexer that has (i) a first input terminal coupled to the second memory block, and configured to receive the first parity data, (ii) a second input terminal coupled to the first memory block, and configured to receive the third parity data, (iii) a control terminal configured to receive the second address bit, and (iv) an output terminal configured to output, based on the second address bit, one of the first parity data and the third parity data as second control data.

9. The IC of claim 8, wherein the address fault detection system further comprises an inverter that is configured to receive the first address bit and output the second address bit.

10. The IC of claim 8, wherein the address fault detection system further comprises a concatenation circuit that is coupled to the fault management circuit and the output terminals of the first and second multiplexers, and configured to (i) receive the first control data and the second control data, (ii) concatenate the first control data and the second control data to generate concatenated data, and (iii) provide the concatenated data to the fault management circuit, and wherein the concatenated data comprises the first reference data and the first parity data when the first address bit is activated.

11. An integrated circuit (IC), comprising:
a memory that comprises a first memory block and a second memory block; and
an address fault detection system that is coupled to the memory, wherein the address fault detection system comprises:
 a parity generator that is configured to (i) receive first reference data for a write operation associated with the memory, and (ii) generate first parity data based on the first reference data; and
 a write access circuit that is coupled to the parity generator and the memory, and configured to:
  receive (i) a first address for the write operation, (ii) the first reference data, and (iii) the first parity data; and
  write, based on the first address, the first reference data to the first memory block and the first parity data to the second memory block, wherein an address fault is detected in the memory based on the first reference data and the first parity data written to the first memory block and the second memory block, respectively;
 wherein the first address comprises (i) a first address bit that corresponds to a most significant bit of the first address, and (ii) a first set of address bits that is indicative of a second address of the first and second memory blocks;
 the write access circuit further comprising an address decoder that is coupled to the first and second memory blocks, and configured to receive the first address, decode the first address to extract the second address and the first address bit, and provide the second address to each of the first and second memory blocks and a controller that is coupled to the parity generator and the first and second memory blocks, and configured to receive the first reference data and the first parity data, and write the first reference data to the first memory block and the first parity data to the second memory block;
 wherein the address fault detection system further comprises an inverter that is coupled to the address decoder, and configured to receive the first address bit and output a second address bit that is an inverted version of the first address bit; and
  wherein the address decoder and the inverter are further configured to provide the first and second address bits to a first set of enable pins and a second set of enable pins associated with the first memory block, respectively, wherein the address decoder and the inverter are further configured to provide the first and second address bits to a third set of enable pins and a fourth set of enable pins associated with the second memory block, respectively, and wherein the first set of enable pins and the fourth set of enable pins are associated with reference data storage in the first and second memory blocks, respectively, and the second set of enable pins and the third set of enable pins are associated with parity data storage in the first and second memory blocks, respectively.

12. The IC of claim 11, wherein the write access circuit writes the first reference data at the second address of the first memory block and the first parity data at the second address of the second memory block.

13. An integrated circuit (IC), comprising:
a memory that comprises a first memory block and a second memory block; and
an address fault detection system that is coupled to the memory, wherein the address fault detection system comprises:
 a parity generator that is configured to receive a first reference data set for a set of write operations associated with the memory, respectively, and generate a first parity data set based on the first reference data set, respectively;
 a write access circuit that is coupled to the parity generator and the memory, and configured to receive a set of addresses for the set of write operations, respectively, the first reference data set, and the first parity data set, and write, based on the set of addresses, the first reference data set to the first memory block and the first parity data set to the second memory block, respectively;
 a read access circuit that is coupled to the memory, and configured to receive a first address for a read operation associated with the memory, and read, based on the first address, first reference data of the first reference data set from the first memory block and first parity data of the first parity data set from the second memory block, wherein the set of addresses comprises the first address; wherein the first address comprises (i) a first address bit that corresponds to a most significant bit of the first address, and (ii) a first set of address bits that is indicative of a second address of the first and second memory blocks; and
 wherein to read the first reference data and the first parity data from the first and second memory blocks, respectively, the read access circuit is further configured to:
  provide the second address to each of the first and second memory blocks; and
  receive the first reference data and third parity data as a response from the first memory block, and second reference data and the first parity data as a response from the second memory block, wherein based on the first address bit, the first reference data and the first parity data are read from the first and second memory blocks, respectively;
 and
 a fault management circuit that is coupled to the read access circuit, and configured to receive the first reference data and the first parity data, generate second parity data based on the first reference data, and compare the first parity data and the second parity data to detect an address fault in the memory.

14. The IC of claim 13, further comprising a functional circuit that is configured to initiate the set of write operations and the read operation, wherein the fault management circuit is further coupled to the functional circuit, and configured to:
 generate a fault indication signal that is indicative of the detected address fault, wherein when the first parity data matches the second parity data, the fault indication signal is deactivated to indicate absence of the address fault, and wherein when the first parity data does not match the second parity data, the fault indication signal is activated to indicate presence of the address fault; and provide the fault indication signal and the first reference data to the functional circuit.

* * * * *